(12) United States Patent
Forbes

(10) Patent No.: US 7,224,024 B2
(45) Date of Patent: May 29, 2007

(54) SINGLE TRANSISTOR VERTICAL MEMORY GAIN CELL

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 194 days.

(21) Appl. No.: 10/231,397

(22) Filed: Aug. 29, 2002

(65) Prior Publication Data

US 2004/0042256 A1 Mar. 4, 2004

(51) Int. Cl.
*H01L 29/76* (2006.01)

(52) U.S. Cl. .................. 257/329; 257/296; 257/302; 257/315; 257/329; 257/314

(58) Field of Classification Search ............. 257/296, 257/302, 314, 315, 329, 347, 353; 365/149
See application file for complete search history.

(56) References Cited

U.S. PATENT DOCUMENTS

| | | | |
|---|---|---|---|
| 4,130,892 A | 12/1978 | Gunckel et al. | |
| 4,826,780 A | 5/1989 | Takemoto et al. | 437/37 |
| 4,970,689 A | 11/1990 | Kenney | 365/189.01 |
| 4,999,811 A | 3/1991 | Banerjee | 365/149 |
| 5,006,909 A | 4/1991 | Kosa | |
| 5,017,504 A | 5/1991 | Nishimura et al. | 437/40 |
| 5,021,355 A | 6/1991 | Dhong et al. | 437/35 |
| 5,042,011 A | 8/1991 | Casper et al. | 365/205 |
| 5,066,607 A | 11/1991 | Banerjee | 437/52 |
| 5,122,986 A | 6/1992 | Lim et al. | 365/189.11 |
| 5,220,530 A | 6/1993 | Itoh | 365/189.01 |
| 5,280,205 A | 1/1994 | Green et al. | 307/530 |
| 5,291,438 A | 3/1994 | Witek et al. | |
| 5,308,783 A | 5/1994 | Krautschneider et al. | 437/52 |
| 5,329,481 A | 7/1994 | Seevinck et al. | |

(Continued)

OTHER PUBLICATIONS

Mukai, M., et al., "A novel merged gain cell for logic compatible high density DRAMs", *1997 Symposium on VLSI Technology, Digest of Technical Papers*, (Jun. 10–12, 1997), 155–156.

Adler, E., et al., "The Evolution of IBM CMOS DRAM Technology", *IBM Journal of Research & Development, vol. 39*, (1995), pp. 167–188.

Blalock, T. N., et al., "An Experimental 2T Cell RAM with 7 NS Access Time at Low Temperature", *IEEE*, 1990 Symposium on VLSi Circuits, Alabama Microelectronics Science and Technology Center, Electrical Engineering Department, (1990),pp. 13–14.

Kim, Wonchan, et al., "A low–voltage multi–bit DRAM cell with a built–in gain stage", *Esscirc 93, Nineteenth European Solid–State Circuits Conference*, (1995), 1 page.

Kim, W., "An Experimental High–Density DRAM Cell with a Built–in Gain Stage", *IEEE Journal of Solid–State Circuits, vol. 29, No. 8*, (1994), pp. 978–981.

Krautschneider, W.H., et al., "Fully scalable gain memory cell for future DRAMs", *Microelectron Eng. (Netherlands)*, Microlelctronic Engineering, vol. 15, No. 1–4,(1991), 1 page.

(Continued)

*Primary Examiner*—Doug Menz
(74) *Attorney, Agent, or Firm*—Schwegman, Lundberg, Woessner & Kluth, P.A.

(57) ABSTRACT

A high density vertical single transistor gain cell is realized for DRAM operation. The gain cell includes a vertical transistor having a source region, a drain region, and a floating body region therebetween. A gate opposes the floating body region and is separated therefrom by a gate oxide on a first side of the vertical transistor. A floating body back gate opposes the floating body region on a second side of the vertical transistor and is separated therefrom by a dielectric to form a body capacitor.

39 Claims, 11 Drawing Sheets

U.S. PATENT DOCUMENTS

| | | |
|---|---|---|
| 5,378,914 A | 1/1995 | Ohzu et al. ................. 257/369 |
| 5,385,853 A | 1/1995 | Mohammad ................. 437/41 |
| 5,414,288 A | 5/1995 | Fitch et al. ................. 257/328 |
| 5,448,513 A | 9/1995 | Hu et al. ................. 365/150 |
| 5,519,236 A | 5/1996 | Ozaki ................. 257/302 |
| 5,574,299 A | 11/1996 | Kim ................. 257/296 |
| 5,627,785 A | 5/1997 | Gilliam et al. ......... 365/189.01 |
| 5,707,885 A | 1/1998 | Lim ................. 437/52 |
| 5,719,409 A | 2/1998 | Singh et al. ................. 257/77 |
| 5,732,014 A | 3/1998 | Forbes ................. 365/149 |
| 5,793,686 A | 8/1998 | Furutani et al. |
| 5,815,432 A | 9/1998 | Naffziger et al. |
| 5,854,500 A | 12/1998 | Krautschneider ........... 257/300 |
| 5,897,351 A | 4/1999 | Forbes ................. 438/242 |
| 5,909,618 A | 6/1999 | Forbes et al. ............... 438/242 |
| 5,936,274 A | 8/1999 | Forbes et al. ............... 257/315 |
| 5,937,296 A | 8/1999 | Arnold |
| 5,966,319 A | 10/1999 | Sato |
| 5,973,356 A | 10/1999 | Noble et al. ................. 257/319 |
| 5,991,225 A | 11/1999 | Forbes et al. .......... 365/230.06 |
| 5,995,419 A | 11/1999 | Trimberger |
| 5,998,820 A | 12/1999 | Chi |
| 5,999,442 A | 12/1999 | Van Der Sanden et al. |
| 6,031,263 A | 2/2000 | Forbes et al. ............... 257/315 |
| 6,072,209 A | 6/2000 | Noble et al. ................. 257/296 |
| 6,077,745 A | 6/2000 | Burns, Jr. et al. |
| 6,097,065 A | 8/2000 | Forbes et al. ............... 257/350 |
| 6,104,061 A | 8/2000 | Forbes et al. ............... 257/330 |
| 6,111,286 A | 8/2000 | Chi et al. |
| 6,118,152 A | 9/2000 | Yamaguchi et al. |
| 6,124,729 A | 9/2000 | Noble et al. ................. 326/41 |
| 6,143,636 A | 11/2000 | Forbes et al. ............... 438/587 |
| 6,150,687 A | 11/2000 | Noble et al. ................. 257/302 |
| 6,153,468 A | 11/2000 | Forbes et al. ............... 438/257 |
| 6,172,390 B1 | 1/2001 | Rupp et al. |
| 6,172,901 B1 | 1/2001 | Portacci |
| 6,191,448 B1 | 2/2001 | Forbes et al. ............... 257/330 |
| 6,204,115 B1 | 3/2001 | Cho |
| 6,238,976 B1 | 5/2001 | Noble et al. ............... 438/259 |
| 6,246,083 B1 | 6/2001 | Noble ................. 257/296 |
| 6,249,020 B1 | 6/2001 | Forbes et al. ............... 257/315 |
| 6,249,460 B1 | 6/2001 | Forbes et al. .......... 365/185.28 |
| 6,282,115 B1 | 8/2001 | Furukawa et al. |
| 6,307,775 B1 | 10/2001 | Forbes et al. .......... 365/185.01 |
| 6,316,309 B1 | 11/2001 | Holmes et al. |
| 6,350,635 B1 | 2/2002 | Noble et al. ............... 438/156 |
| 6,384,448 B1 | 5/2002 | Forbes ................. 257/315 |
| 6,399,979 B1 | 6/2002 | Noble et al. ................. 257/302 |
| 6,440,801 B1 | 8/2002 | Furukawa et al. |
| 6,456,535 B2 | 9/2002 | Forbes et al. .......... 365/185.28 |
| 6,492,233 B2 | 12/2002 | Forbes et al. ............... 438/270 |
| 6,501,116 B2 | 12/2002 | Kisu et al. ................. 257/296 |
| 6,504,201 B1 | 1/2003 | Noble et al. ................. 257/302 |
| 6,538,916 B2 * | 3/2003 | Ohsawa ................. 365/149 |
| 6,549,453 B2 | 4/2003 | Wong |
| 6,556,471 B2 | 4/2003 | Chappell et al. |
| 6,560,139 B2 | 5/2003 | Ma et al. |
| 6,566,682 B2 | 5/2003 | Forbes |
| 6,611,451 B1 | 8/2003 | Houston |
| 6,624,033 B2 | 9/2003 | Noble |
| 6,661,042 B2 | 12/2003 | Hsu |
| 6,680,864 B2 | 1/2004 | Noble ................. 365/177 |
| 6,686,624 B2 | 2/2004 | Hsu |
| 6,710,465 B2 | 3/2004 | Song et al. |
| 6,727,141 B1 | 4/2004 | Bronner et al. |
| 6,750,095 B1 | 6/2004 | Bertagnoll et al. |
| 6,838,723 B2 | 1/2005 | Forbes |
| 6,940,761 B2 | 9/2005 | Forbes |
| 6,943,083 B2 | 9/2005 | Forbes |
| 6,956,256 B2 | 10/2005 | Forbes |
| 6,975,531 B2 | 12/2005 | Forbes |
| 7,030,436 B2 | 4/2006 | Forbes |
| 2001/0028078 A1 | 10/2001 | Noble ................. 257/303 |
| 2001/0030338 A1 | 10/2001 | Noble ................. 257/303 |
| 2001/0032997 A1 | 10/2001 | Forbes et al. ............... 257/315 |
| 2001/0053096 A1 | 12/2001 | Forbes et al. .......... 365/185.28 |
| 2002/0098639 A1 | 7/2002 | Kisu et al. ................. 438/238 |
| 2002/0126536 A1 | 9/2002 | Forbes et al. .......... 365/185.28 |
| 2003/0001191 A1 | 1/2003 | Forbes et al. ............... 257/306 |
| 2003/0129001 A1 | 7/2003 | Kisu et al. ................. 399/200 |
| 2003/0205754 A1 | 11/2003 | Forbes et al. ............... 257/314 |
| 2004/0026728 A1 | 2/2004 | Yoshida et al. |
| 2004/0041236 A1 | 3/2004 | Forbes |
| 2005/0012130 A1 | 1/2005 | Forbes |
| 2005/0024936 A1 | 2/2005 | Forbes |
| 2005/0032313 A1 | 2/2005 | Forbes |
| 2005/0041457 A1 | 2/2005 | Forbes |
| 2005/0068828 A1 | 3/2005 | Forbes |
| 2005/0094453 A1 | 5/2005 | Forbes |
| 2005/0263763 A1 | 12/2005 | Bhattacharyya |
| 2005/0265069 A1 | 12/2005 | Forbes |
| 2006/0028859 A1 | 2/2006 | Forbes |
| 2006/0043411 A1 | 3/2006 | Bhattacharayya |

OTHER PUBLICATIONS

Krautschneider, F., "Planar Gain Cell for Low Voltage Operation and Gigabit Memories", *Symposium on VLSI Technology Digest of Technical Papers*, (1995), pp. 139–140.

Mukai, M , et al., "Proposal of a Logic Compatible Merged–Type Gain Cell for High Density Embedded . . . ", *IEEE Trans. on Electron Devices*, (1999), 2 pages.

Ohsawa, T , "Memory design using one–transistor gain cell on SOI", *IEEE International Solid–State Circuits Conference. Digest of Technical Papers, vol. 1,* (2002), pp. 152–455.

Okhonin, S , "A SOI capacitor–less 1T–DRAM concept", *2001 IEEE International SOI Conference. Proceedings, IEEE. 2001,* (2000), pp. 153–154.

Rabaey, Jan M., "Digital integrated circuits : a design perspective", Book, Published Upper Saddle River, N.J.: Prentice Hall c1996,(1996), pp. 585–590.

Shukuri, S , "A complementary gain cell technology for sub–1 V supply DRAMs", *Electron Devices Meeting 1992, Technical Digest,* (1992), pp. 1006–1009.

Shukuri, S. , "A Semi–Static Complementary Gain Cell Technology for Sub–1 V Supply DRAMs", *IEEE Transactions on Electron Devices, vol. 41, No. 6,* (Jun. 1994), pp. 926–931.

Shukuri, S. , "Super–Low Voltage Operation of a Semi–Static Complementary Gain DRAM Memory Cell", *Symposium on VLSI Technology, Digest of Technical Papers,* (1993), pp. 23–24.

Sunouchi, K , et al., "A self–amplifying (SEA) cell for future high density DRAMs", *International Electron Devices Meeting 1991. Technical Digest,* (1991), pp. 465–468.

Takato, H. , et al., "Process Integration Trends for Embedded DRAM", *Proceedings of UISI Process Integration, Electrochemical Society Proceedings,* 99–18, (1999), 2 pages.

Terauchi, M. , "A Surrounding Gate Transistor (SGT) Gain Cell for Ultra High Density DRAMs", *1993 Symposium on VLSI Technology, Digest of Technical Papers,* Kyoto, Japan, (1993), pp. 21–22.

Wann, H. , et al., "A Capacitorless DRAM Cell on SOI Substrate", *International Electron Devices Meeting 1993. Technical Digest,* (1993), pp. 635–638.

* cited by examiner

US 7,224,024 B2

SINGLE TRANSISTOR VERTICAL MEMORY GAIN CELL

CROSS REFERENCE TO RELATED APPLICATIONS

This application is related to the following co-pending, commonly assigned U.S. patent application: "Merged MOS-Bipolar Capacitor Memory Cell," Ser. No. 10/230,929, which is filed on even date herewith and which disclosure is herein incorporated by reference.

FIELD OF THE INVENTION

The present invention relates generally to integrated circuits, and in particular to a single transistor vertical memory gain cell.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 140 and an access field effect transistor or transfer device 120. For each cell, one side of the storage capacitor 140 is connected to a reference voltage (illustrated as a ground potential for convenience purposes). The other side of the storage capacitor 140 is connected to the drain of the transfer device 120. The gate of the transfer device 120 is connected to a signal known in the art as a word line 180. The source of the transfer device 120 is connected to a signal known in the art as a bit line 160 (also known in the art as a digit line). With the memory cell 100 components connected in this manner, it is apparent that the word line 180 controls access to the storage capacitor 140 by allowing or preventing the signal (representing a logic "0" or a logic "1") carried on the bit line 160 to be written to or read from the storage capacitor 140. Thus, each cell 100 contains one bit of data (i.e., a logic "0" or logic "1").

In FIG. 2 a DRAM circuit 240 is illustrated. The DRAM 240 contains a memory array 242, row and column decoders 244, 248 and a sense amplifier circuit 246. The memory array 242 consists of a plurality of memory cells 200 (constructed as illustrated in FIG. 1) whose word lines 280 and bit lines 260 are commonly arranged into rows and columns, respectively. The bit lines 260 of the memory array 242 are connected to the sense amplifier circuit 246, while its word lines 280 are connected to the row decoder 244. Address and control signals are input on address/control lines 261 into the DRAM 240 and connected to the column decoder 248, sense amplifier circuit 246 and row decoder 244 and are used to gain read and write access, among other things, to the memory array 242.

The column decoder 248 is connected to the sense amplifier circuit 246 via control and column select signals on column select lines 262. The sense amplifier circuit 246 receives input data destined for the memory array 242 and outputs data read from the memory array 242 over input/output (I/O) data lines 263. Data is read from the cells of the memory array 242 by activating a word line 280 (via the row decoder 244), which couples all of the memory cells corresponding to that word line to respective bit lines 260, which define the columns of the array. One or more bit lines 260 are also activated. When a particular word line 280 and bit lines 260 are activated, the sense amplifier circuit 246 connected to a bit line column detects and amplifies the data bit transferred from the storage capacitor of the memory cell to its bit line 260 by measuring the potential difference between the activated bit line 260 and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

The memory cells of dynamic random access memories (DRAMs) are comprised of two main components, a field-effect transistor (FET) and a capacitor which functions as a storage element. The need to increase the storage capability of semiconductor memory devices has led to the development of very large scale integrated (VLSI) cells which provides a substantial increase in component density. As component density has increased, cell capacitance has had to be decreased because of the need to maintain isolation between adjacent devices in the memory array. However, reduction in memory cell capacitance reduces the electrical signal output from the memory cells, making detection of the memory cell output signal more difficult. Thus, as the density of DRAM devices increases, it becomes more and more difficult to obtain reasonable storage capacity.

As DRAM devices are projected as operating in the gigabit range, the ability to form such a large number of storage capacitors requires smaller areas. However, this conflicts with the requirement for larger capacitance because capacitance is proportional to area. Moreover, the trend for reduction in power supply voltages results in stored charge reduction and leads to degradation of immunity to alpha particle induced soft errors, both of which require that the storage capacitance be even larger.

In order to meet the high density requirements of VLSI cells in DRAM cells, some manufacturers are utilizing DRAM memory cell designs based on non-planar capacitor structures, such as complicated stacked capacitor structures and deep trench capacitor structures. Although non-planar capacitor structures provide increased cell capacitance, such arrangements create other problems that effect performance of the memory cell. For example, trench capacitors are fabricated in trenches formed in the semiconductor substrate, the problem of trench-to-trench charge leakage caused by the parasitic transistor effect between adjacent trenches is enhanced. Moreover, the alpha-particle component of normal background radiation can generate hole-electron pairs in the silicon substrate which functions as one of the storage plates of the trench capacitor. This phenomena will cause a charge stored within the affected cell capacitor to rapidly dissipate, resulting in a soft error.

Another approach has been to provide DRAM cells having a dynamic gain. These memory cells are commonly referred to as gain cells. For example, U. S. Pat. No. 5,220,530 discloses a two-transistor gain-type dynamic random access memory cell. The memory cell includes two field-effect transistors, one of the transistors functioning as write transistor and the other transistor functioning as a data storage transistor. The storage transistor is capacitively coupled via an insulating layer to the word line to receive substrate biasing by capacitive coupling from the read word line. This gain cell arrangement requires a word line, a bit or data line, and a separate power supply line which is a disadvantage, particularly in high density memory structures.

The inventors have previously disclosed a DRAM gain cell using two transistors. (See generally, L. Forbes, "Merged Transistor Structure for Gain Memory Cell," U.S. Pat. No. 5,732,014, issued 24 Mar. 1998, continuation granted as U.S. Pat. No. 5,897,351, issued 27 Apr. 1999). A number of other gain cells have also been disclosed. (See generally, Sunouchi et al., "A self-Amplifying (SEA) Cell for Future High Density DRAMs," Ext. Abstracts of IEEE Int. Electron Device Meeting, pp. 465–468 (1991); M. Terauchi et al., "A Surrounding Gate Transistor (SGT) Gain Cell for Ultra High Density DRAMS," VLSI Tech. Symposium, pp. 21–22 (1993); S. Shukuri et al., "Super-Low-Voltage Operation of a Semi-Static Complementary Gain RAM Memory Cell," VLSI Tech. Symposium pp. 23–24 (1993); S. Shukuri et al., "Super-low-voltage operation of a semi-static complementary gain DRAM memory cell," Ext. Abs. of IEEE Int. Electron Device Meeting, pp. 1006–1009 (1992); S. Shukuri et al., "A Semi-Static Complementary Gain Cell Technology for Sub-1 V Supply DRAM's," IEEE Trans. on Electron Devices, Vol. 41, pp. 926–931 (1994); H. Wann and C. Hu, "A Capacitorless DRAM Cell on SOI Substrate," Ext. Abs. IEEE Int. Electron Devices Meeting, pp. 635–638; W. Kim et al., "An Experimental High-Density DRAM Cell with a Built-in Gain Stage," IEEE J. of Solid-State Circuits, Vol. 29, pp. 978–981 (1994); W. H. Krautschneider et al., "Planar Gain Cell for Low Voltage Operation and Gigabit Memories," Proc. VLSI Technology Symposium, pp. 139–140 (1995); D. M. Kenney, "Charge Amplifying trench Memory Cell," U.S. Pat. No. 4,970,689, 13 Nov. 1990; M. Itoh, "Semiconductor memory element and method of fabricating the same," U.S. Pat. No. 5,220,530, 15 Jun. 1993; W. H. Krautschneider et al., "Process for the Manufacture of a high density Cell Array of Gain Memory Cells," U.S. Pat. No. 5,308,783, 3 May 1994; C. Hu et al., "Capacitorless DRAM device on Silicon on Insulator Substrate," U.S. Pat. No. 5,448,513, 5 Sep. 1995; S. K. Banerjee, "Method of making a Trench DRAM cell with Dynamic Gain," U.S. Pat. No. 5,066,607, 19 Nov. 1991; S. K. Banerjee, "Trench DRAM cell with Dynamic Gain," U.S. Pat. No. 4,999,811, 12 Mar. 1991; Lim et al., "Two transistor DRAM cell," U.S. Pat. No. 5,122,986, 16 Jun. 1992).

Recently a one transistor gain cell has been reported as shown in FIG. 3. (See generally, T. Ohsawa et al., "Memory design using one transistor gain cell on SOI," IEEE Int. Solid State Circuits Conference, San Francisco, 2002, pp. 152–153). FIG. 3 illustrates a portion of a DRAM memory circuit containing two neighboring gain cells, 301 and 303. Each gain cell, 301 and 303, is separated from a substrate 305 by a buried oxide layer 307. The gain cells, 301 and 303, are formed on the buried oxide 307 and thus have a floating body, 309-1 and 309-2 respectively, separating a source region 311 (shared for the two cells) and a drain region 313-1 and 313-2. A bit/data line 315 is coupled to the drain regions 313-1 and 313-2 via bit contacts, 317-1 and 317-2. A ground source 319 is coupled to the source region 311. Wordlines or gates, 321-1 and 321-2, oppose the floating body regions 309-1 and 309-2 and are separated therefrom by a gate oxide, 323-1 and 323-2.

In the gain cell shown in FIG. 3 a floating body, 309-1 and 309-2, back gate bias is used to modulate the threshold voltage and consequently the conductivity of the NMOS transistor in each gain cell. The potential of the back gate body, 309-1 and 309-2, is made more positive by avalanche breakdown in the drain regions, 313-1 and 313-2, and collection of the holes generated by the body, 309-1 and 309-2. A more positive potential or forward bias applied to the body, 309-1 and 309-2, decreases the threshold voltage and makes the transistor more conductive when addressed. Charge storage is accomplished by this additional charge stored on the floating body, 309-1 and 309-2. Reset is accomplished by forward biasing the drain-body n-p junction diode to remove charge from the body.

Still, there is a need in the art for a memory cell structure for dynamic random access memory devices, which produces a large amplitude output signal without significantly increasing the size of the memory cell to improve memory densities.

SUMMARY OF THE INVENTION

The above mentioned problems with conventional memories and other problems are addressed by the present invention and will be understood by reading and studying the following specification. A high density vertical single transistor gain cell is realized for DRAM operation.

In one embodiment of the present invention, a gain cell includes a vertical transistor having a source region, a drain region, and a floating body region therebetween. A gate opposes the floating body region and is separated therefrom by a gate oxide on a first side of the vertical transistor. A floating body back gate opposes the floating body region on a second side of the vertical transistor and is separated therefrom by a dielectric to form a body capacitor. The floating body back gate includes a capacitor plate and forms a capacitor with the floating body. The capacitor is operable to increase a capacitance of the floating body and enables charge storage on the floating body. Thus, the floating body back gate is operable to modulate the threshold voltage and conductivity of the vertical transistor.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
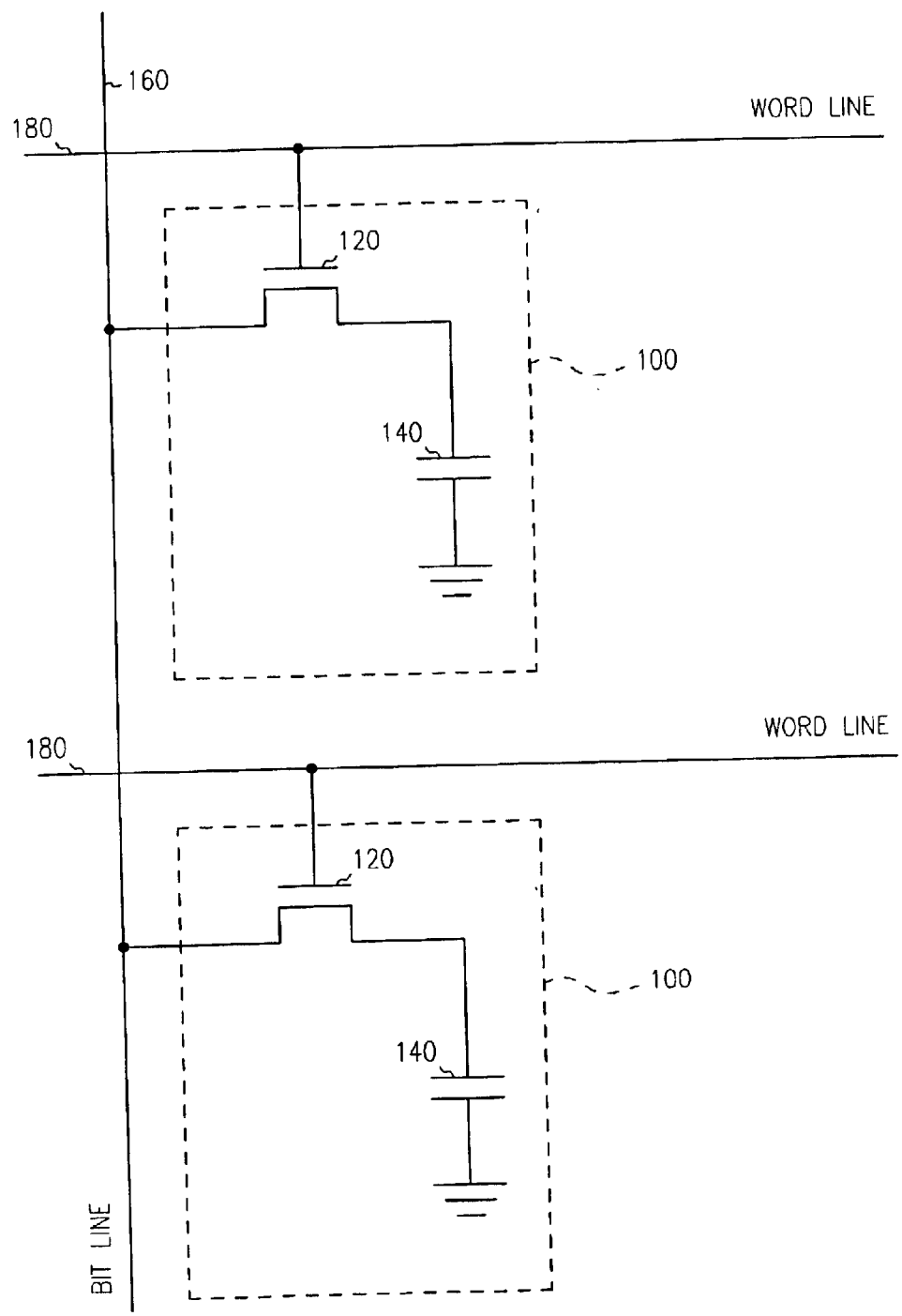
FIG. 1 is a circuit diagram illustrating conventional dynamic random access memory (DRAM) cells.
Figure 2:
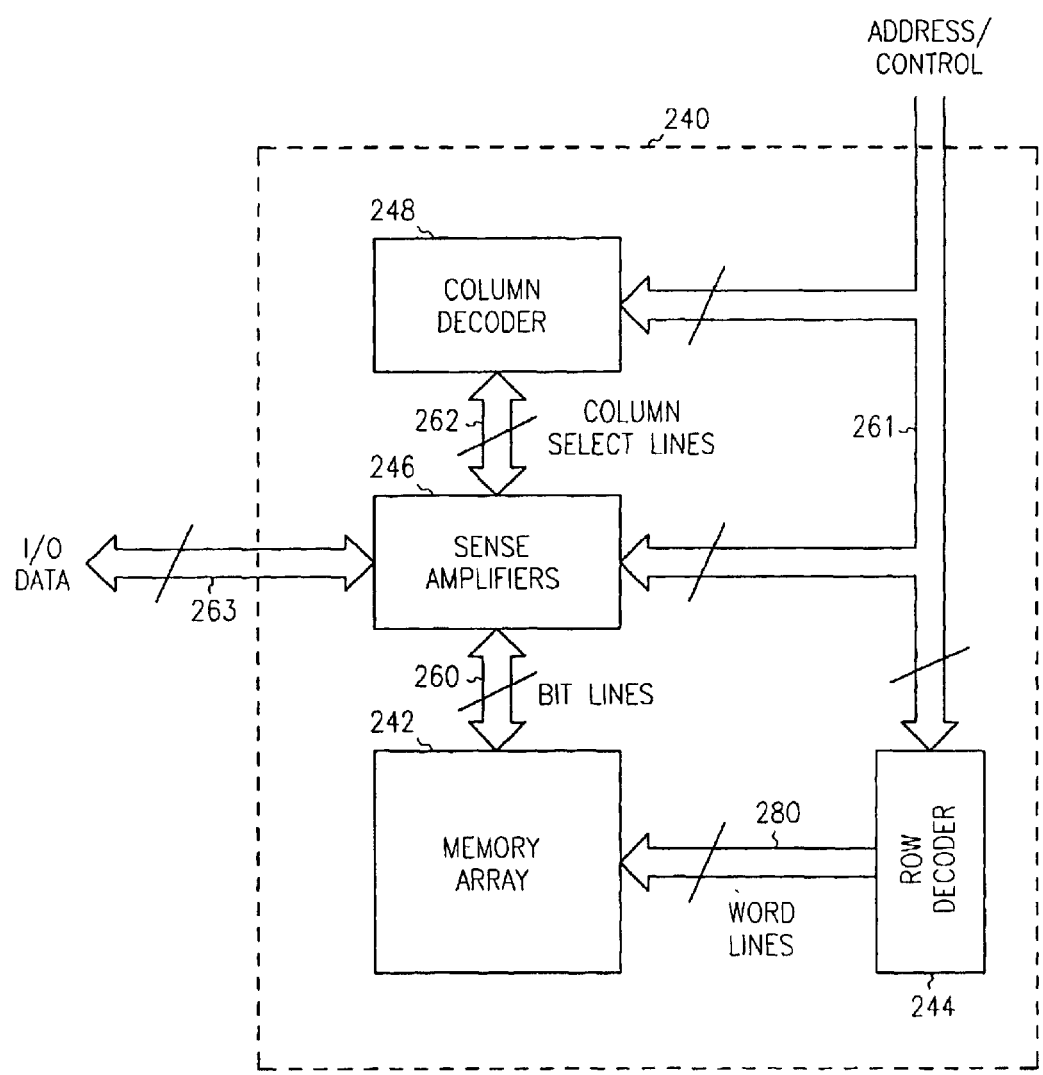
FIG. 2 is a block diagram illustrating a DRAM device.
Figure 3:
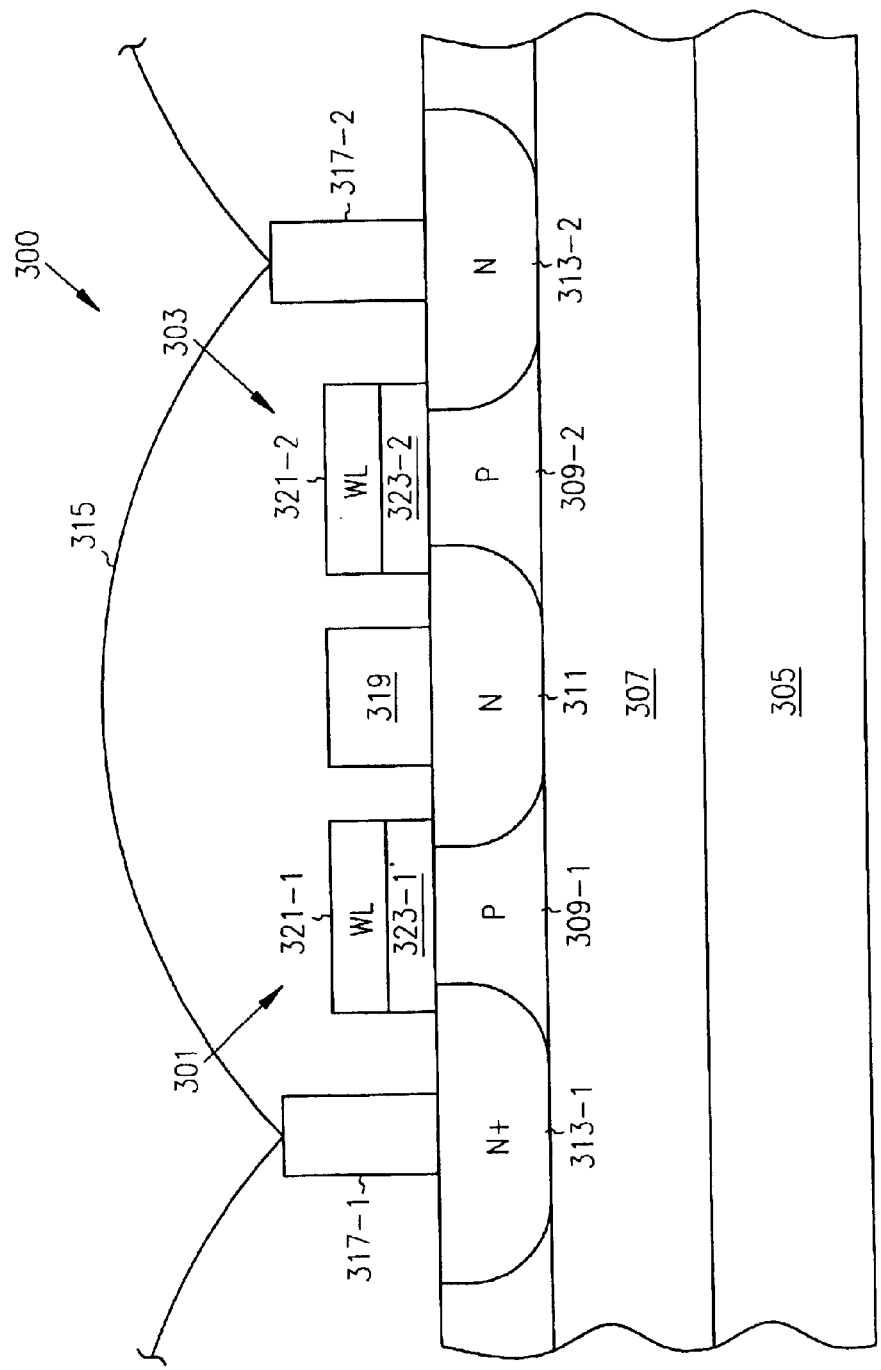
FIG. 3 illustrates a portion of a DRAM memory circuit containing two neighboring gain cells.
Figure 4A:
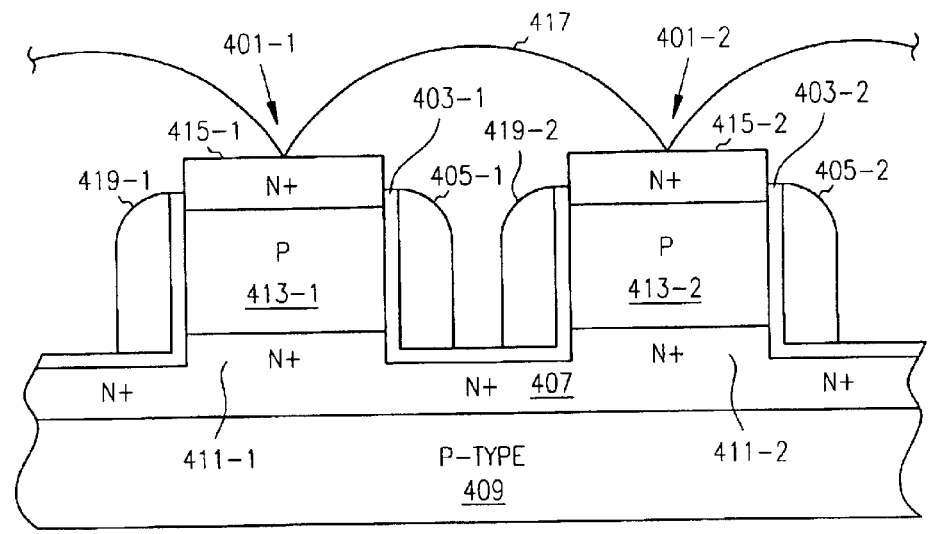
FIG. 4A is a cross-sectional view illustrating an embodiment of a pair of memory cells according to the teachings of the present invention.

FIG. 4A is a cross-sectional view illustrating an embodiment of a pair of memory cells, 401-1 and 401-2, according to the teachings of the present invention. The embodiment of the memory cells, 401-1 and 401-2, in FIG. 4A differ from those shown in FIG. 3 in that the transistors are vertical allowing for a separate body capacitor, 403-1 and 403-2, and body capacitor plate, 405-1 and 405-2, on one side of the vertical transistor cells, 401-1 and 401-2.

In the embodiment of FIG. 4A, each gain cell, 401-1 and 401-2, along a column of an array is formed on an n+ conductivity type sourceline 407 formed on a p-type substrate 409. The vertical transistors 401-1 and 401-2 include an n+source region, 411-1 and 411-2 respectively, which in some embodiments is integrally formed with the sourceline 407. In the embodiment of FIG. 4A a p-type conductivity material which serves as the body regions, 413-1 and 413-2, is formed vertically on the n+source regions, 411-1 and 411-2. An n+type conductivity material is formed vertically on the body regions, 413-1 and 413-2, and serves as the drain regions, 415-1 and 415-2. A data/bit line 417 couples to the drain regions, 415-1 and 415-2, along columns of an array. A gate, 419-1 and 419-2, is formed on another side of the vertical transistor cells, 401-1 and 401-2 from the body capacitor, 403-1 and 403-2, and body capacitor plate, 405-1 and 405-2.

Figure 4B:
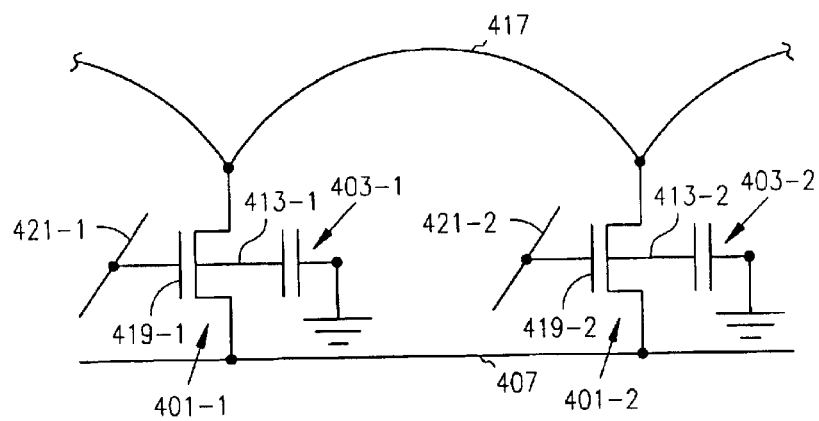
FIG. 4B illustrates an electrical equivalent circuit of the pair of memory cells shown in FIG. 4A.

FIG. 4B illustrates an electrical equivalent circuit for the pair of memory cells, 401-1 and 401-2 shown in FIG. 4A. In FIG. 4B, wordlines 421-1 and 421-2 are shown connected to gates 419-1 and 419-2. According to the teachings of the present invention, the body capacitor, 403-1 and 403-2, in each cell, 401-1 and 401-2, increases the capacitance of the floating body, 413-1 and 413-2, and enables more charge storage.

Figure 4C:
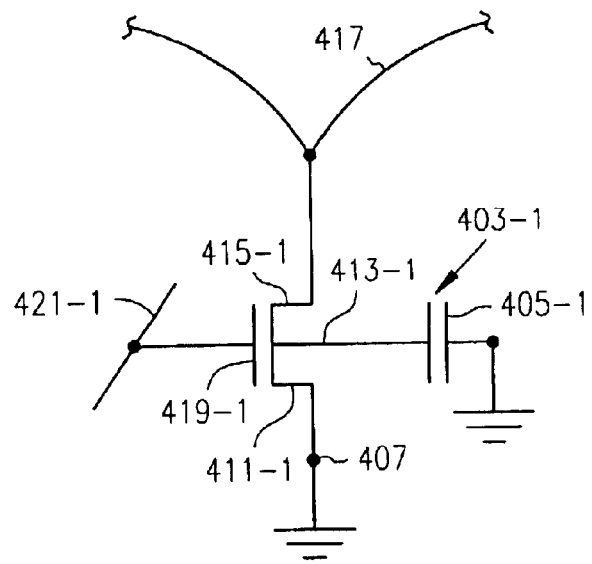
FIG. 4C illustrates an embodiment for one mode of operation according to the teachings of the present invention.

FIG. 4C shows a single vertical cell, e.g. 401-1 from FIGS. 4A and 4B, and illustrates an embodiment for one mode of operation according to the teachings of the present invention. In the mode of operation, shown in FIG. 4C, the body capacitor plate 405-1 and the source region 411-1 are grounded. The mode of operation, shown in FIG. 4C, is similar to that of the cell shown in FIG. 3. Data, e.g. a one (1) state, is written onto the cell 401-1 by applying both positive gate 419-1 and drain 415-1 voltage causing avalanche breakdown and the body to collect the holes which are generated.

Figure 5:
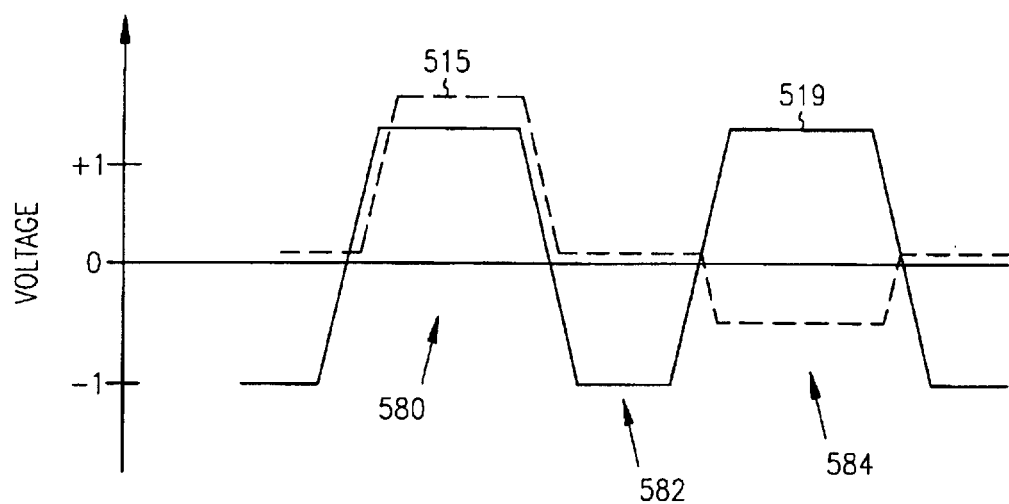
FIG. 5 illustrates an embodiment of voltage waveforms used to write data on to the floating body of a memory cell according to the teachings of the present invention.

FIG. 5 illustrates the voltage waveforms used to write data on to the floating body. The voltage waveform at the drain is represented at 515 and the voltage waveform at the gate is represented at 519. In a first stage 580 to write a first memory state (e.g. "WRITE ONE"), a positive voltage is applied to both the gate 419-1 and the drain 415-1 causing avalanche breakdown and the body 413-1 to collect the holes which are generated. The standby condition 582, or "HOLD" condition, places the word line 421-1 and gate 419-1 at a negative voltage which drives the body 413-1 to a negative potential by virtue of the capacitive coupling of the body 413-1 to the word line and gate 419-1. In a second stage 584 to write a second memory state (e.g. "WRITE ZERO"), the gate 419-1 is driven positive and the drain 415-1 is driven negative. This action forward biases the drain 415-1 and body 413-1 junction and removes any stored charge.

The cell 401-1 is read by addressing the word line 421-1 and determining the conductivity of the transistor 401-1. If the body 413-1 has stored charge it will have a more positive potential than normal. The more positive potential causes the threshold voltage of the transistor 401-1 to be lower and the device to conduct more than normal as shown in FIG. 6.

Figure 6:
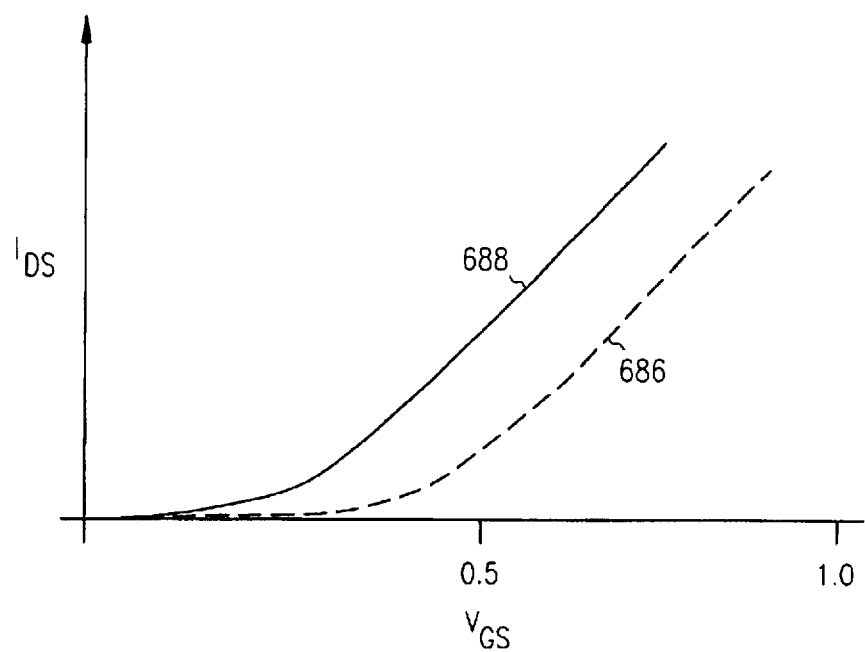
FIG. 6 is a graph plotting the drain current versus the gate voltage for a memory cell according to the teachings of the present invention.

FIG. 6 is a graph plotting the drain current $I_{DS}$ versus the gate voltage $V_{GS}$ for the vertical memory cells of the present invention. FIG. 6 illustrates the difference in transistor current, with small $V_{DS}$, with and without stored floating body charge. In FIG. 6, the dashed line, represented at 686, represents the second state "zero" stored and the solid line, represented at 688, represents the first state "one" stored.

Figure 4D:
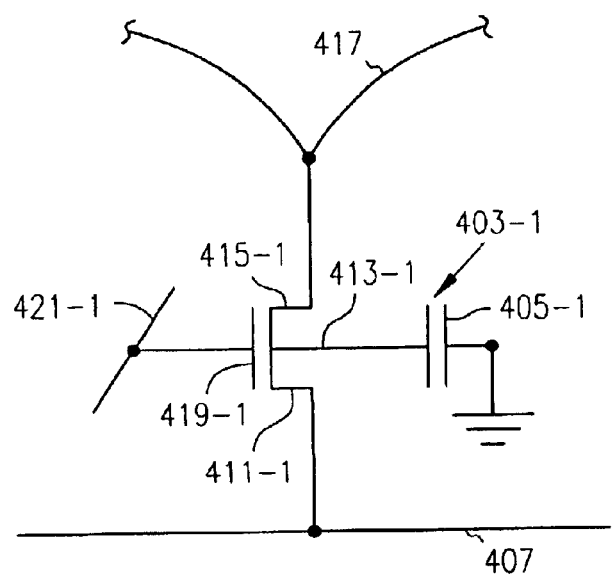
FIG. 4D illustrates another embodiment for a mode of operation according to the teachings of the present invention.

FIG. 4D illustrates another embodiment for a mode of operation of the single vertical cell, e.g. 401-1 from FIGS. 4A and 4B. In the embodiment of FIG. 4D, the mode of operation is to also allow provisions for biasing the source line 407 to appositive potential. Biasing the sourceline 407 to a positive potential can be used in conjunction with a negative word line 421-1 voltage to drive the p-type body 413-1 and n-type source and drain, 411-1 and 415-1 respectively, junctions to a larger reverse bias during standby. This insures the floating body 413-1 will not become forward biased during standby. Thus, stored charge will not be lost due to leakage currents with forward bias.

Figure 7:
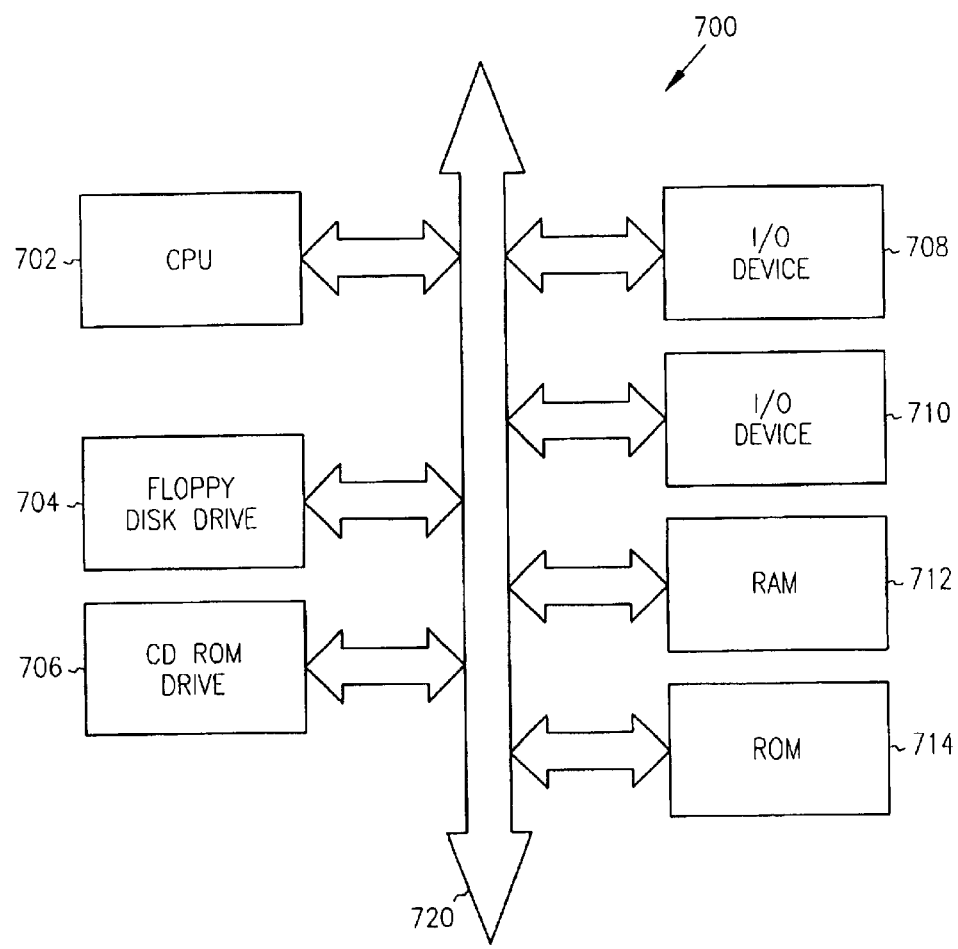
FIG. 7 is a block diagram illustrating an embodiment of an electronic system utilizing the memory cells of the present invention.

FIG. 7 is a block diagram of a processor-based system 700 utilizing single transistor vertical memory gain cells constructed in accordance with the present invention. That is, the system 700 utilizes the memory cell illustrated in FIGS. 4A–4D. The processor-based system 700 may be a computer system, a process control system or any other system employing a processor and associated memory. The system 700 includes a central processing unit (CPU) 702, e.g., a microprocessor, that communicates with the RAM 712 and an I/O device 708 over a bus 720. It must be noted that the bus 720 may be a series of buses and bridges commonly used in a processor-based system, but for convenience purposes only, the bus 720 has been illustrated as a single bus. A second I/O device 710 is illustrated, but is not necessary to practice the invention. The processor-based system 700 also includes read-only memory (ROM) 714 and may include peripheral devices such as a floppy disk drive 704 and a compact disk (CD) ROM drive 706 that also communicates with the CPU 702 over the bus 720 as is well known in the art.

It should be noted that the memory state stored on the floating body back gate can be determined as a separate operation by measuring independently the threshold voltage of the transfer devices.

It will be appreciated by those skilled in the art that additional circuitry and control signals can be provided, and that the memory device 700 has been simplified to help focus on the invention.

It will be understood that the embodiment shown in FIG. 7 illustrates an embodiment for electronic system circuitry in which the novel memory cells of the present invention are used. The illustration of system 701, as shown in FIG. 7, is intended to provide a general understanding of one application for the structure and circuitry of the present invention, and is not intended to serve as a complete description of all the elements and features of an electronic system using the novel memory cell structures. Further, the invention is equally applicable to any size and type of system 700 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Methods of Fabrication

The inventors have previously disclosed a variety of vertical devices and applications employing transistors along the sides of rows or fins etched into bulk silicon or silicon on insulator wafers for devices in array type applications in memories. (See generally, U.S. Pat. Nos. 6,072,209; 6,150,687; 5,936,274 and 6,143,636; 5,973,356 and 6,238,976; 5,991,225 and 6,153,468; 6,124,729; 6,097,065). The present invention uses similar techniques to fabricate the single transistor vertical memory gain cell described herein. Each of the above reference US Patents is incorporated in full herein by reference.

Figure 8A:
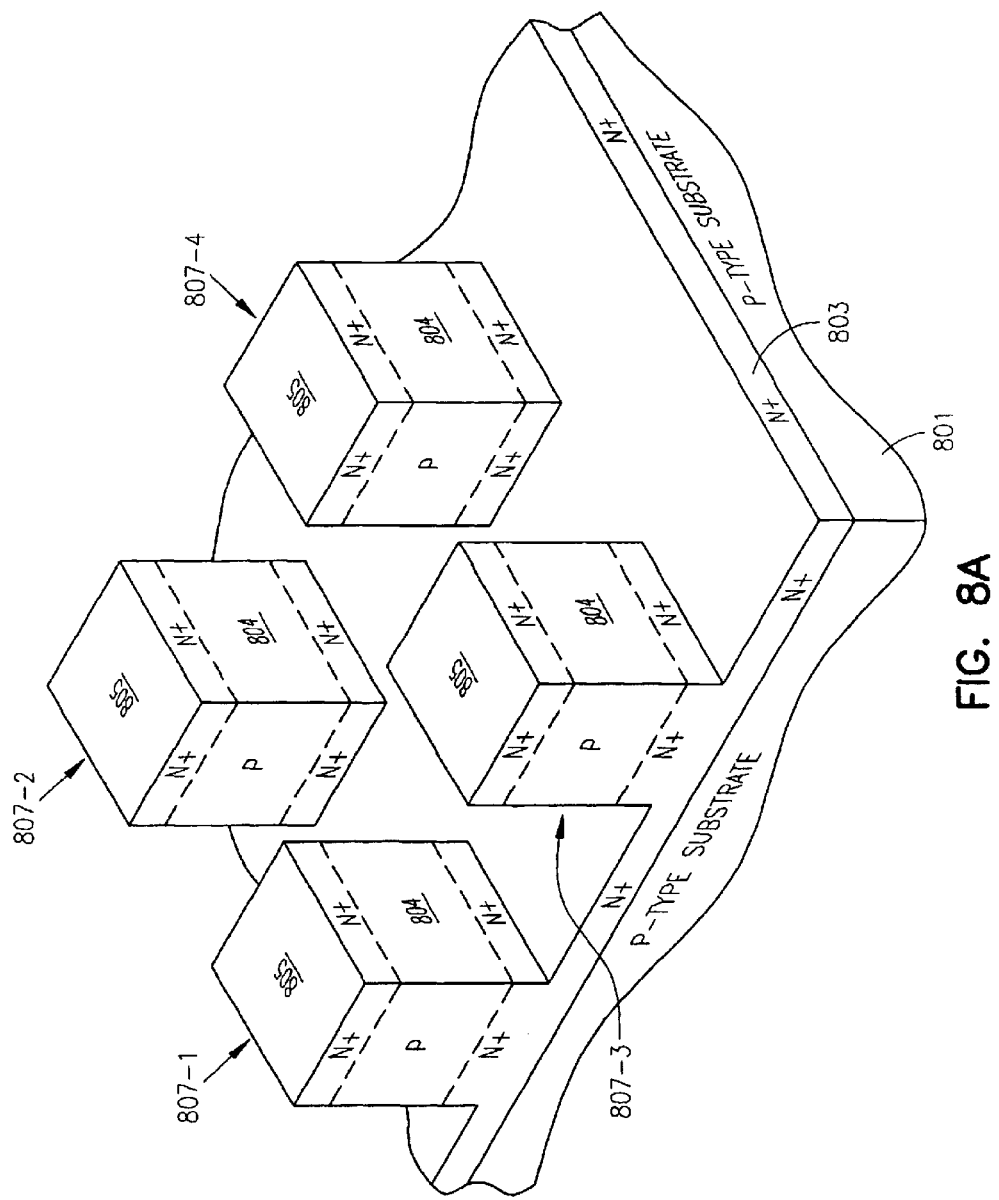
FIGS. 8A and 8B illustrate one embodiment of a fabrication technique for memory cells according to the teachings of the present invention.

FIG. 8A outlines one embodiment of a fabrication technique for the embodiment illustrated in FIG. 4C. In FIG. 8A, a p-type substrate 801 has been processed to include layers thereon of an n+ conductivity type 803, a p conductivity type 804, and another n+ conductivity type 805. In the embodiment of FIG. 8A, the fabrication continues with the wafer being oxidized and then a silicon nitride layer (not shown) is deposited to act as an etch mask for an anisotropic or directional silicon etch which will follow. This nitride mask and underlying oxide are patterned and trenches are etched as shown in both directions leaving blocks of silicon, e.g. 807-1, 807-2, 807-3, and 807-4, having alternating layers of n and p type conductivity material. Any number of such blocks can be formed on the wafer.

Figure 8B:
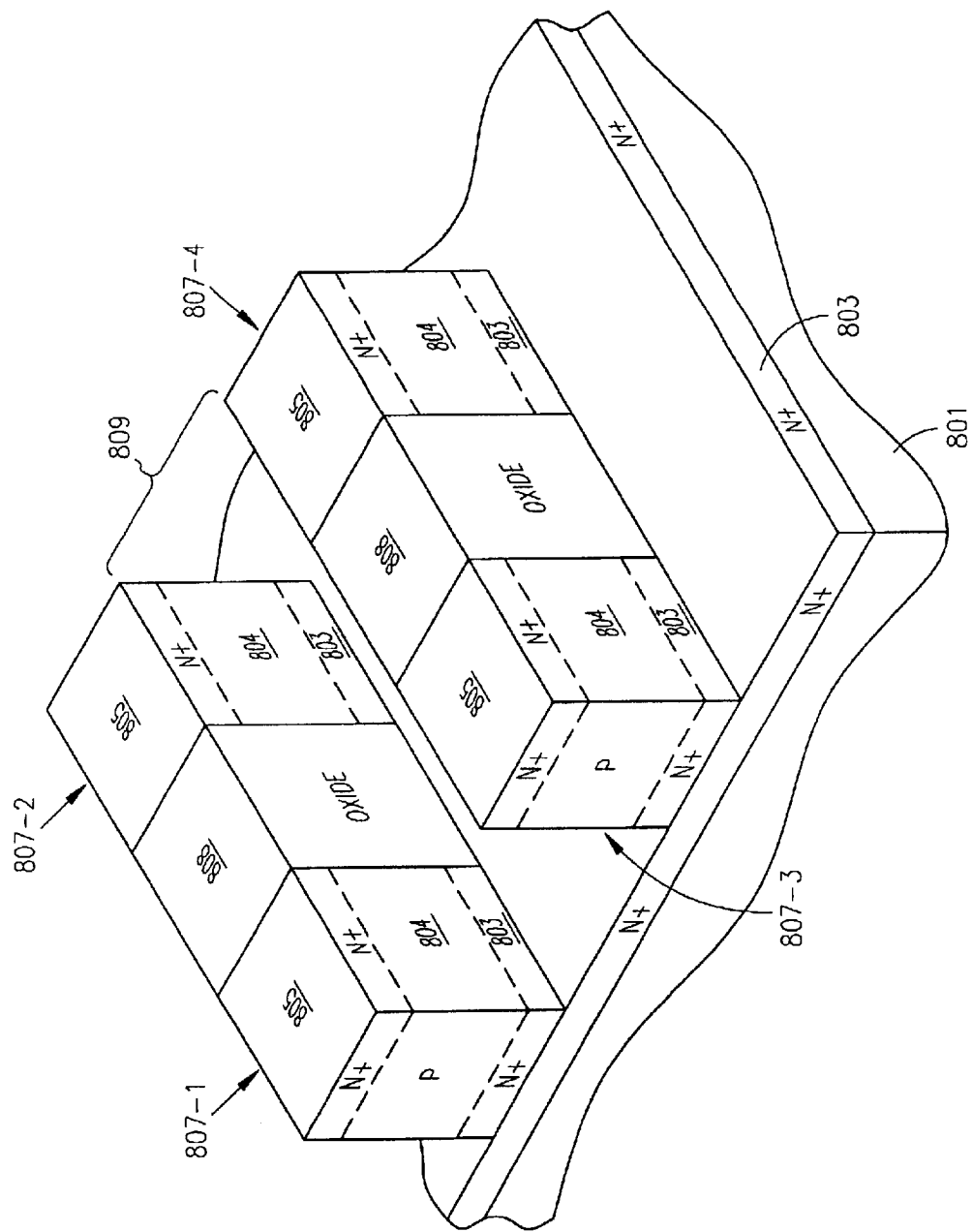

In FIG. 8B, the fabrication has continued with both trenches being filled with oxide 808 and the whole structure planarized by CMP. Oxide is then removed from the trenches, e.g. 809, for the eventual word line and capacitor plate formation. The remaining structure as shown can be realized by conventional techniques including gate oxidation and deposition and anisotropic etch of polysilicon along the sidewalls to form body capacitor and word lines. The data or bit lines on top can be realized using conventional metallurgy.

Figure 9A:
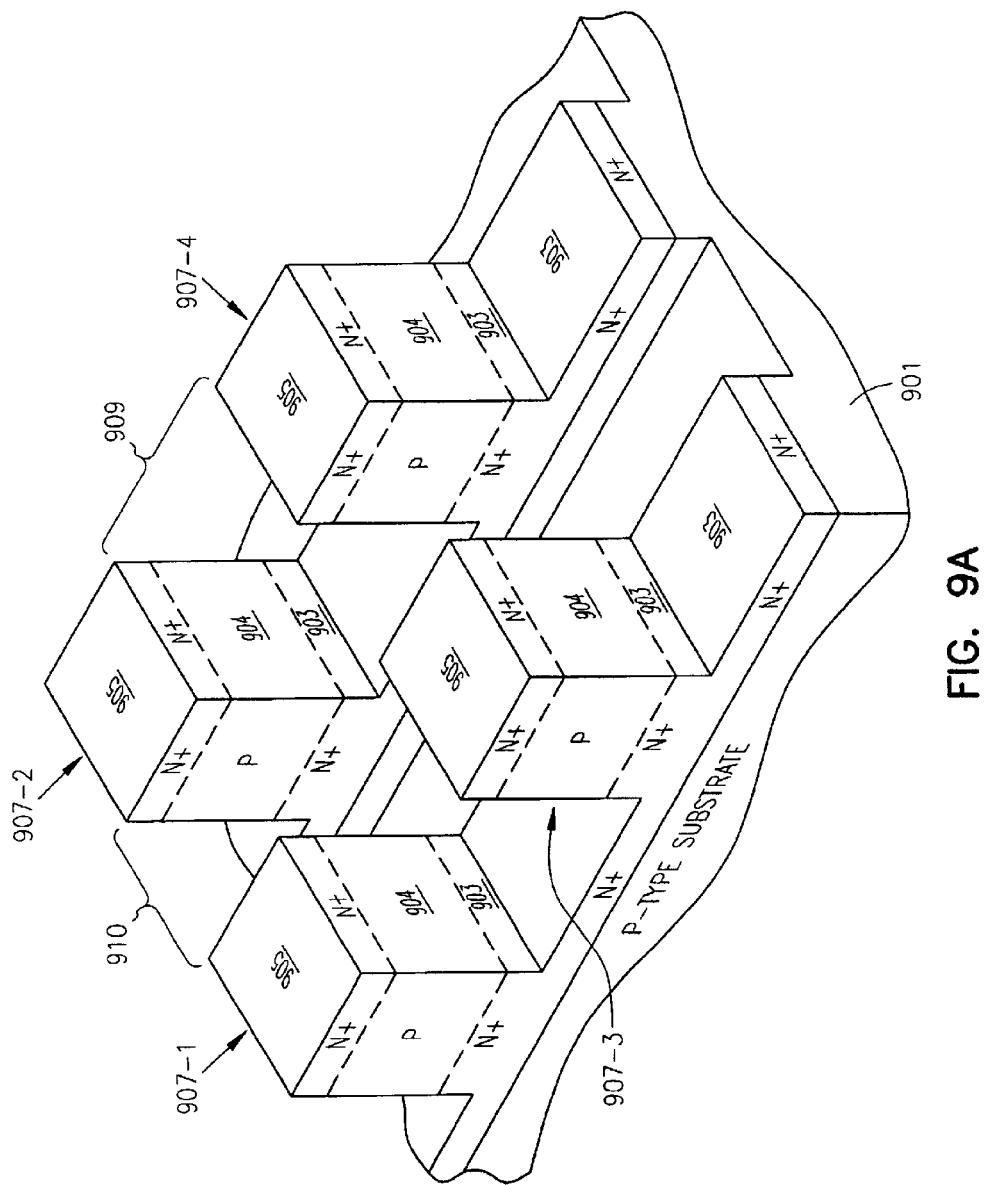
FIGS. 9A and 9B illustrate another embodiment of a fabrication technique for memory cells according to the teachings of the present invention.
Figure 9B:
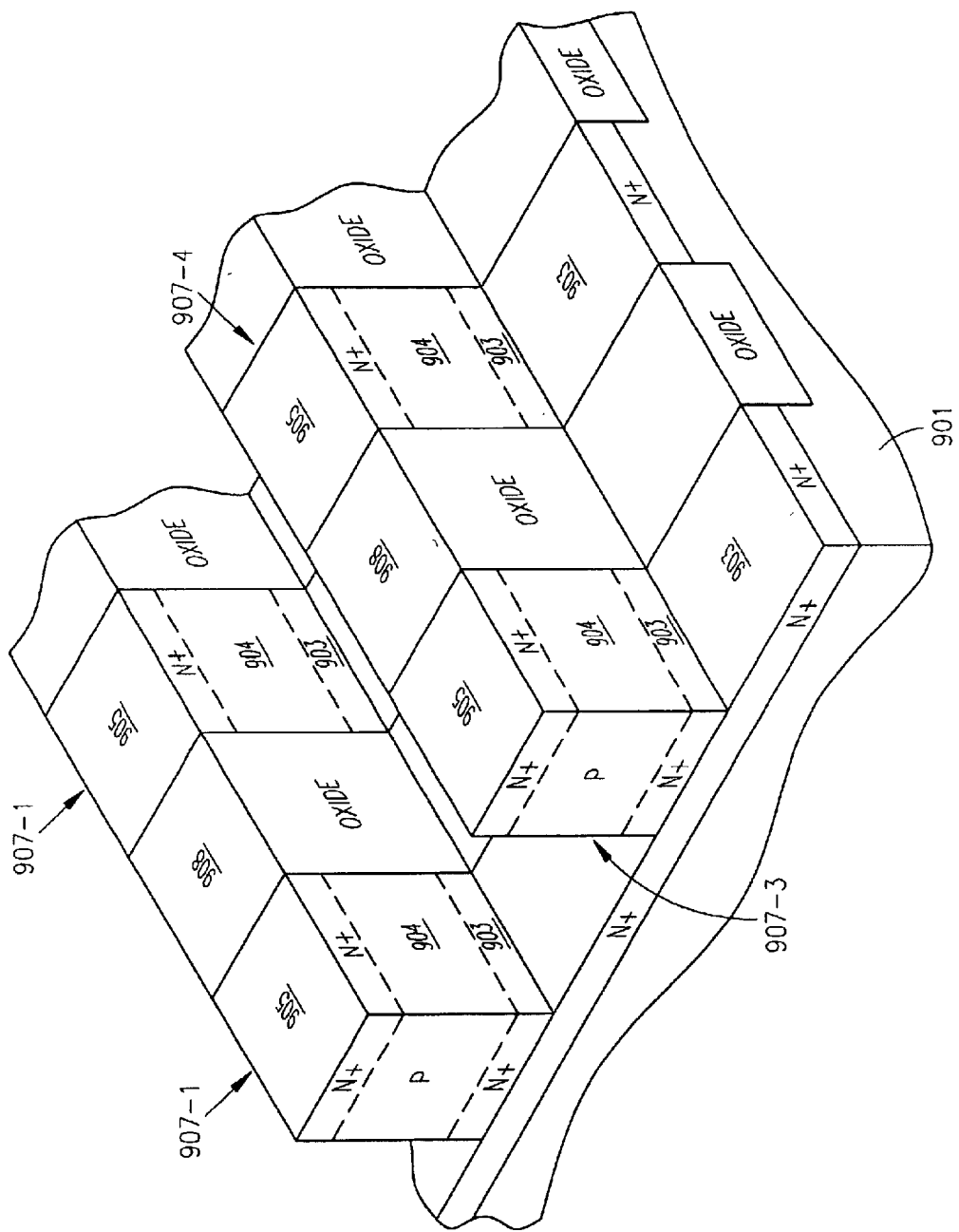

FIG. 9A outlines one embodiment of a fabrication technique for the embodiment illustrated in FIG. 4D. In FIG. 9A, a p-type substrate 901 has been processed to include layers thereon of an n+conductivity type 903, a p conductivity type 904, and another n+ conductivity type 905. In the embodiment of FIG. 9A, the fabrication continues with the wafer being oxidized and then a silicon nitride layer (not shown) is deposited to act as an etch mask for an anisotropic or directional silicon etch which will follow. This nitride mask and underlying oxide are patterned and trenches are etched as shown in both directions leaving blocks of silicon, e.g. 907-1, 907-2, 907-3, and 907-4, having alternating layers of n and p type conductivity material. Any number of such blocks can be formed on the wafer.

In the embodiment of FIG. 9A, two masking steps are used and one set of trenches, e.g. trench 910, is made deeper than the other, e.g. trench 909, in order to provide separation and isolation of the source lines 903. As before, both trenches are filled with oxide and the whole structure planarized by CMP. The remaining fabrication proceeds as previously described and will result in devices with the equivalent circuit shown in FIG. 4D.

While the description here has been given for a p-type substrate, an alternative embodiment would work equally well with n-type or silicon-on-insulator substrates. In that case, the sense transistor would be a PMOS transistor with an n-type floating body.

CONCLUSION

The cell can provide a very high gain and amplification of the stored charge on the floating body of the NMOS sense transistor. A small change in the threshold voltage caused by charge stored on the floating body will result in a large difference in the number of holes conducted between the drain and source of the NMOS sense transistor during the read data operation. This amplification allows the small storage capacitance of the sense amplifier floating body to be used instead of a large stacked capacitor storage capacitance. The resulting cell has a very high density with a cell area of $4F^2$, where F is the minimum feature size, and whose vertical extent is far less than the total height of a stacked capacitor or trench capacitor cell and access transistor.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A device, comprising:
   a vertical transistor having a source region, a drain region, and a body region therebetween, and further having a first side and a second side;
   a gate opposing the body region on the first side of the vertical transistor; and
   a floating body back gate opposing the body region on the second side of the vertical transistor, wherein the floating body back gate has a thickness approximately equal to the thickness of the gate,
   wherein the gate is connected to a word line to selectively provide the gate with at least a first word line potential and a second word line potential during memory cell operation, the drain region is connected to a bit line to selectively provide the drain region with at least a first bit line potential and a second bit line potential during memory cell operation, the source region is connected to a source line to selectively provide the source region with at least a first source line potential and a second source line potential during memory cell operation, and a fixed potential is applied to the floating body back gate during memory cell operation.

2. The device of claim 1, including a memory cell, wherein the memory cell comprises the vertical transistor, the gate and the floating body back gate.

3. The device of claim 2, wherein the memory cell includes a single transistor memory gain cell.

4. The device of claim 2, wherein, for a minimum feature size F, the memory cell has a cell area of $4F^2$.

5. The device of claim 1, including a memory array, the memory cell including the vertical transistor having the source region, the drain region, and the body region therebetween, the gate, and the floating body back gate.

6. The device of claim 5, including an electronic system, the electronic system comprising a processor and a memory coupled to the processor, wherein the memory includes the memory array.

7. A memory cell, comprising:
   a vertical transistor having a source region, a drain region, and a body region therebetween;
   a gate opposing the body region and separated therefrom by a gate oxide on a first side of the vertical transistor; and
   a floating body back gate opposing the body region on a second side of the vertical transistor, wherein the floating body back gate has a thickness approximately equal to the thickness of the gate,
   wherein the gate is connected to a word line to selectively provide the gate with at least a first word line potential and a second word line potential during memory cell operation, the drain region is connected to a bit line to selectively provide the drain region with at least a first bit line potential and a second bit line potential during memory cell operation, the source region is connected to a source line to selectively provide the source region with at least a first source line potential and a second source line potential during memory cell operation, and a fixed potential is applied to the floating body back gate during memory cell operation.

8. The memory cell of claim 7, wherein the floating body back gate is used to modulate the threshold voltage and conductivity of the vertical transistor.

9. The memory cell of claim 7, wherein the body region of the vertical transistor is a floating body.

10. The memory cell of claim 9, wherein the floating body back gate is a capacitor plate and forms a capacitor with the floating body.

11. The memory cell of claim 10, wherein the capacitor is operable to increase a capacitance of the floating body and enables charge storage on the floating body.

12. A single transistor memory gain cell, comprising:
    a vertical transistor having a source region, a drain region, and a floating body region therebetween;
    a gate opposing the floating body region and separated therefrom by a gate oxide on a first side of the vertical transistor;
    a floating body back gate opposing the body region on a second side of the vertical transistor, wherein the floating body back gate is used to modulate the threshold voltage and conductivity of the vertical transistor, and wherein the floating body back gate has a thickness approximately equal to the thickness of the gate,
    wherein the gate is connected to a word line to selectively provide the gate with at least a first word line potential and a second word line potential during memory cell operation, the drain region is connected to a bit line to selectively provide the drain region with at least a first bit line potential and a second bit line potential during memory cell operation, the source region is connected to a source line to selectively provide the source region with at least a first source line potential and a second source line potential during memory cell operation, and a fixed potential is applied to the floating body back gate during memory cell operation.

13. The memory gain cell of claim 12, wherein the floating body back gate is a capacitor plate and forms a capacitor with the floating body.

14. The memory gain cell of claim 13, wherein the capacitor is operable to increase a capacitance of the floating body and enables charge storage on the floating body.

15. The memory gain cell of claim 12, wherein the vertical transistor is a p-channel MOS transistor (PMOS).

16. The memory gain cell of claim 12, wherein the memory gain cell is a dynamic random access memory (DRAM) cell.

17. A Memory array, comprising:
    a number of vertical transistors formed on a substrate, wherein each vertical transistor includes;
      a source region;
      a drain region;
      a floating body region formed vertically between the source and drain region, wherein the floating body region operable to store a charge;
      a gate opposing the floating body region and separated therefrom by a gate oxide on a first side of each vertical transistor; and
      a floating body back gate opposing the floating body region on a second side of the vertical transistor, wherein the floating body back gate has a thickness approximately equal to the thickness of the gate,
    a number of bitlines coupled to the drain regions along columns in the array,
    wherein of bitlines coupled to the drain regions along columns in the array, provide the gate with at least a first word line potential and a second word line potential during memory cell operation, the drain region is connected to one of the bit lines to selectively provide the drain region with at least a first bit line potential and a second bit line potential during memory cell operation, the source region is connected to a source line to selectively provide the source region with at least a first source line potential and a second source line potential during memory cell operation, and a fixed potential is applied to the floating body back gate during memory cell operation.

18. The memory array of claim 17, wherein the gate and the floating body back gate are formed on opposite sides of each vertical transistor.

19. The memory array of claim 17, wherein the array further includes a number of sourcelines, wherein the source region of each vertical transistor is coupled to a souceline along columns in the array.

20. The memory array of claim 17, wherein in each vertical transistor the floating body back gate is operable to modulate a threshold voltage and a conductivity of the vertical transistor.

21. The memory array of claim 17, wherein in each vetical transistor the floating body back gate is a capacitor plate and forms a body capacitor with the floating body.

22. The memory array of claim 21, wherein the body capacitor is operable to increase a capacitance of the floating body and enables charge storage on the floating body.

23. The memory array of claim 17, wherein the memory array is included in a dynamic random access memory (DRAM) chip.

24. An electronic system, comprising:
a processor; and
a memory operably coupled to the processor, wherein the memory includes a memory array having;
a number of vertical transistors, wherein each vertical transistor includes:
a source region;
a drain region;
a floating body region formed vertically between the source and drain region, wherein the floating body region operable to store a charge;
a gate opposing the floating body region and separated therefrom by a gate oxide on a first side of each vertical transistor; and
a floating body back gate opposing the floating body region on a second side of the vertical transistor, wherein the floating body back gate has a thickness approximately equal to the thickness of the gate,
a number of bitlines coupled to the drain regions along columns in the array,
wherein of bitlines coupled to the drain regions along columns in the array, provide the gate with at least a first word line potential and a second word line potential during memory cell operation, the drain region is connected to one of the bit lines to selectively provide the drain region with at least a first bit line potential and a second bit line potential during memory cell operation, the source region is connected to a source line to selectively provide the source region with at least a first source line potential and a second source line potential during memory cell operation, and a fixed potential is applied to the floating body back gate during memory cell operation.

25. The system of claim 24, wherein the gate and the floating body back gate are formed on opposite sides of each vertical transistor.

26. The system of claim 24, wherein the memory array further includes a number of sourcelines, wherein the source region of each vertical transistor is coupled to a sourceline along columns in the memory array.

27. The system of claim 24, wherein in each vertical transistor the floating body back gate is operable to modulate a threshold voltage and a conductivity of the vertical transistor.

28. The system of claim 24, wherein in each vertical transistor the floating body back gate is a capacitor plate and forms a body capacitor with the floating body.

29. The system of claim 28, wherein the body capacitor is operable to increase a capacitance of the floating body and enables charge storage on the floating body.

30. The system of claim 24, wherein the memory array is included in a dynamic random access memory (DRAM) chip.

31. The system of claim 24, wherein the processor and memory are formed on a single chip.

32. A memory cell, comprising:
a vertical transistor having a source region, a drain region, and a floating body region therebetween;
a gate operably positioned with respect to the floating body region on a first side of the vertical transistor; and
a body capacitor plate operably positioned with respect to the floating body region on a second side of the vertical transistor, wherein the body capacitor plate has a thickness approximately equal to the thickness of the gate,
wherein, for a minimum feature size F, the memory cell has a cell area of $4F^2$,
wherein the gate is connected to a word line to selectively provide the gate with at least a first word line potential and a second word line potential during memory cell operation, the drain region is connected to a bit line to selectively provide the drain region with at least a first bit line potential and a second bit line potential during memory cell operation, the source region is connected to a source line to selectively provide the source region with at least a first source line potential and a second source line potential during memory cell operation, and a fixed potential is applied to the floating body back gate during memory cell operation.

33. The memory cell of claim 32, wherein the body capacitor plate forms a capacitor with the floating body region to enhance charge storage in the floating body region.

34. A memory array, comprising:
a number of memory cells, each memory cell having a cell area of $4F^2$ for a minimum feature size F, each memory cell comprising a vertical transistor, including:
a source region;
a drain region;
a floating body region formed vertically between the source and drain region;
a gate opposing the floating body region on a first side of each vertical transistor; and
a body capacitor plate opposing the floating body region on a second side of the vertical transistor to form a capacitor with the floating body region to enhance charge storage in the floating body region, wherein the body capacitor plate has a thickness approximately equal to the thickness of the gate,
a number of bitlines coupled to the drain regions along columns in the array,
wherein the gate is connected to a word line to selectively provide the gate with at least a first word line potential and a second word line potential during memory cell operation, the drain region is connected to a bit line to selectively provide the drain region with at least a first bit line potential and a second bit line potential during memory cell operation, the source region is connected to a source line to selectively provide the source region with at least a first source line potential and a second source line potential during memory cell operation, and a fixed potential is applied to the floating body back gate during memory cell operation.

35. A memory cell, comprising:

a vertical transistor having a source region, a drain region, and a floating body region therebetween;

a gate opposing the floating body region and separated therefrom by a gate oxide on a first side of the vertical transistor; and means for modulating a threshold voltage and a conductivity of the vertical transistor, wherein the means for modulating includes a floating body back gate opposing the floating body region on a second side of the vertical transistor, wherein the floating body back gate has a thickness approximately equal to the thickness of the gate, wherein the gate is connected to a word line to selectively provide the gate with at least a first word line potential and a second word line potential during memory cell operation, the drain region is connected to a bit line to selectively provide the drain region with at least a first bit line potential and a second bit line potential during memory cell operation, and the source region is connected to a source line to selectively provide the source region with at least a first source line potential and a second source line potential during memory cell operation and a fixed potential is applied to the floating body back gate during memory cell operation.

36. The memory cell of claim 35, wherein the means for modulating includes storing and removing a charge in the floating body region of the vertical transistor.

37. The memory cell of claim 35, wherein means for modulating includes increasing a capacitance of the floating body region of the vertical transistor.

38. The memory cell of claim 35, wherein the vertical transistor is an n-channel MOS transistor (NMOS).

39. The memory cell of claim 35, wherein the memory cell is a dynamic random access memory (DRAM) cell.

* * * * *

UNITED STATES PATENT AND TRADEMARK OFFICE
CERTIFICATE OF CORRECTION

PATENT NO.      : 7,224,024 B2
APPLICATION NO. : 10/231397
DATED           : May 29, 2007
INVENTOR(S)     : Forbes It is certified that error appears in the above-identified patent and that said Letters Patent is hereby corrected as shown below:

On the title page, in field (56), under "Other Publications", in column 2, line 10, delete "VLSi" and insert -- VLSI --, therefor.

On the title page, in field (56), under "Other Publications", in column 2, line 21, delete "Microlelctronic" and insert -- Microelectronic --, therefor.

On page 2, in field (56), under "Other Publications", in column 2, line 17, delete "Prentrice" and insert -- Prentice --, therefor.

In column 5, line 39, delete "horizonal" and insert -- horizontal --, therefor.

In column 5, line 61, delete "n+source" and insert -- n+ source --, therefor.

In column 5, line 65, delete "n+source" and insert -- n+ source --, therefor.

In column 5, line 66, delete "n+type" and insert -- n+ type --, therefor.

In column 6, line 55, after "688" delete "." and insert -- , --, therefor.

In column 6, line 60, delete "appositive" and insert -- a positive --, therefor.

In column 8, line 27, delete "n+conductivity" and insert -- n+ conductivity --, therefor.

In column 10, line 45, in Claim 17, delete "Memory" and insert -- memory --, therefor.

In column 10, lines 62–63, in Claim 17, after "wherein" delete "of bitlines coupled to the drain regions along columns in the array," and insert --, for each vertical transistor, the gate is connected to a word line to selectively --, therefor.

In column 11, line 13, in Claim 19, delete "souceline" and insert -- sourceline --, therefor.

In column 11, line 18, in Claim 21, delete "vetical" and insert -- vertical --, therefor.

In column 11, lines 48–49, in Claim 24, after "wherein" delete "of bitlines coupled to the drain regions along columns in the array," and insert --, for each vertical transistor, the gate is connected to a word line to selectively --, therefor.

In column 12, lines 38–39, in Claim 32, delete "floating body back gate" and insert -- body capacitor plate --, therefor.

UNITED STATES PATENT AND TRADEMARK OFFICE
CERTIFICATE OF CORRECTION

PATENT NO. : 7,224,024 B2
APPLICATION NO. : 10/231397
DATED : May 29, 2007
INVENTOR(S) : Forbes It is certified that error appears in the above-identified patent and that said Letters Patent is hereby corrected as shown below:

In column 12, line 64, in Claim 34, delete "a bit line" and insert --one of the bit lines --, therefor.

In column 13, lines 4–5, in Claim 34, delete "floating body back gate" and insert -- body capacitor plate --, therefor.

Signed and Sealed this

Twenty-seventh Day of November, 2007

JON W. DUDAS
*Director of the United States Patent and Trademark Office*